(12) United States Patent
Tseng

(10) Patent No.: US 12,389,632 B2
(45) Date of Patent: Aug. 12, 2025

(54) TRANSISTORS HAVING SELF-ALIGNED BODY TIE

(71) Applicant: SKYWORKS SOLUTIONS, INC., Irvine, CA (US)

(72) Inventor: Min-Zing Tseng, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 17/706,864

(22) Filed: Mar. 29, 2022

(65) Prior Publication Data

US 2022/0320343 A1 Oct. 6, 2022

Related U.S. Application Data

(60) Provisional application No. 63/168,887, filed on Mar. 31, 2021.

(51) Int. Cl.
*H10D 30/67* (2025.01)
*H10D 30/01* (2025.01)

(52) U.S. Cl.
CPC ..... *H10D 30/6711* (2025.01); *H10D 30/0321* (2025.01)

(58) Field of Classification Search
CPC .................................................. H01L 29/78615
See application file for complete search history.

(56) References Cited

U.S. PATENT DOCUMENTS

| 9,847,349 B1 * | 12/2017 | Monroy Aguirre | H01L 29/0847 |
| 2006/0157791 A1 * | 7/2006 | Lee | H01L 27/0251 257/357 |
| 2010/0013016 A1 | 1/2010 | Shih et al. | |

FOREIGN PATENT DOCUMENTS

| CN | 104409503 A | 3/2015 |
| CN | 202210328581.6 | 3/2022 |
| DE | 102022203028.1 | 3/2022 |
| GB | 2204102.4 | 3/2022 |
| JP | 2022-050401 | 3/2022 |
| KR | 10-2022-0040433 | 3/2022 |
| SG | 10202203166Q | 3/2022 |
| TW | 111112220 | 3/2022 |

OTHER PUBLICATIONS

Varahramyan, K. et al., Three-dimensional modeling and evaluation of body tied versus floating body SOI MOSFETs. Microelectronic Engineering, Feb. 1, 1999, vol. 45, No. 1, pp. 29-37.
Wu, C.L. et al., I-Gate Body-Tied Silicon-on-Insulator MOSFETs With Improved High-Frequency Performance. IEEE Electron Device Letters, Feb. 24, 2011, vol. 32, No. 4, pp. 443-445.

* cited by examiner

Primary Examiner — Raj R Gupta
(74) Attorney, Agent, or Firm — Chang & Hale LLP

(57) ABSTRACT

A transistor can include a source and a drain with each implemented in a first type active region, a gate implemented relative to the source and the drain, and a body implemented in the first type active region and substantially covered by the gate. The transistor can further include a body tie implemented in a second type active region and including a connecting portion substantially covered by the gate and engaging the body. The first and second active regions can be dimensioned to provide a gap therebetween on each side of the gate.

10 Claims, 11 Drawing Sheets

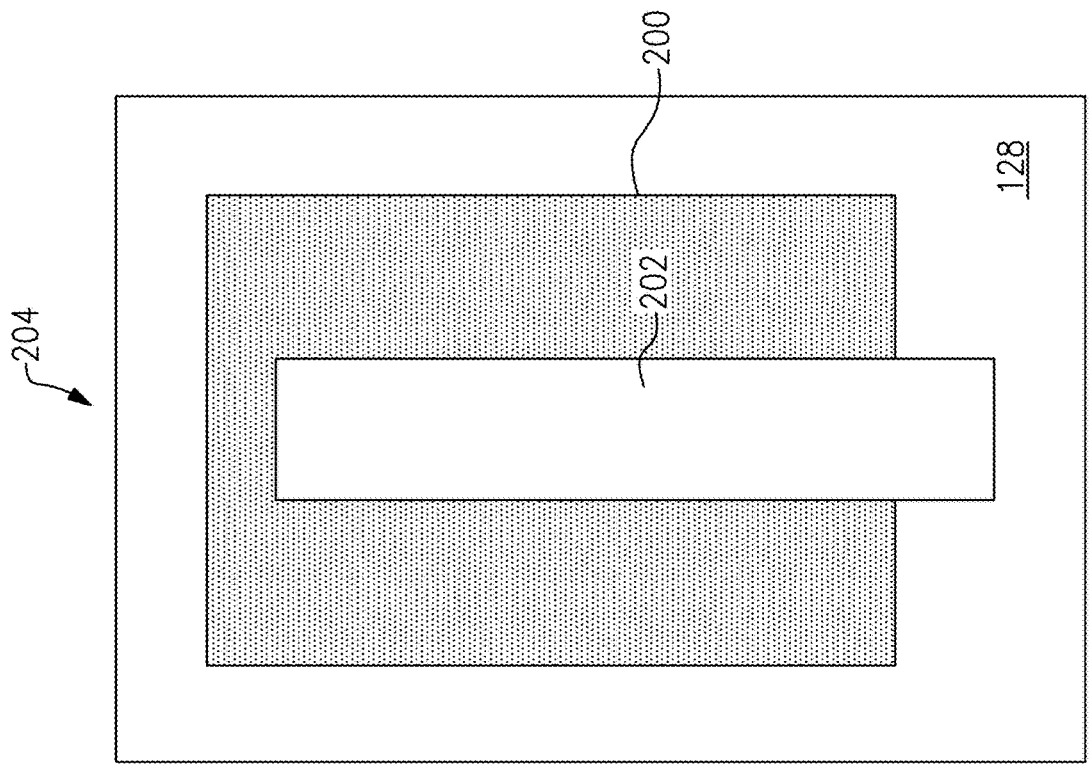
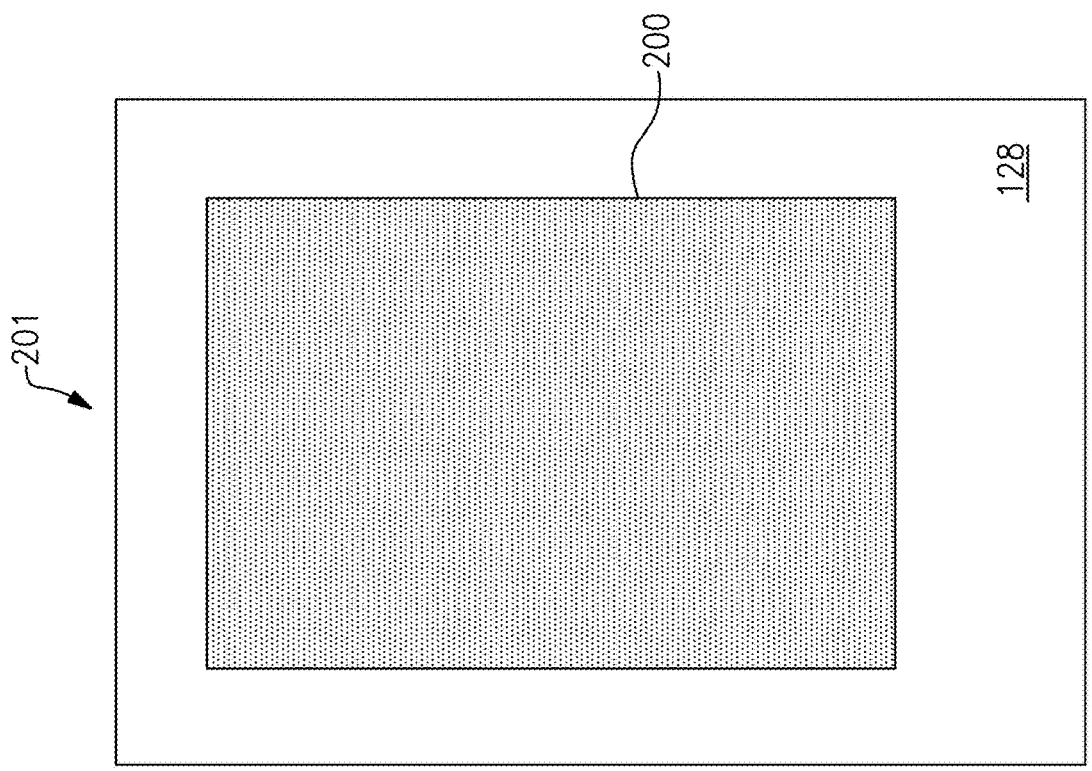

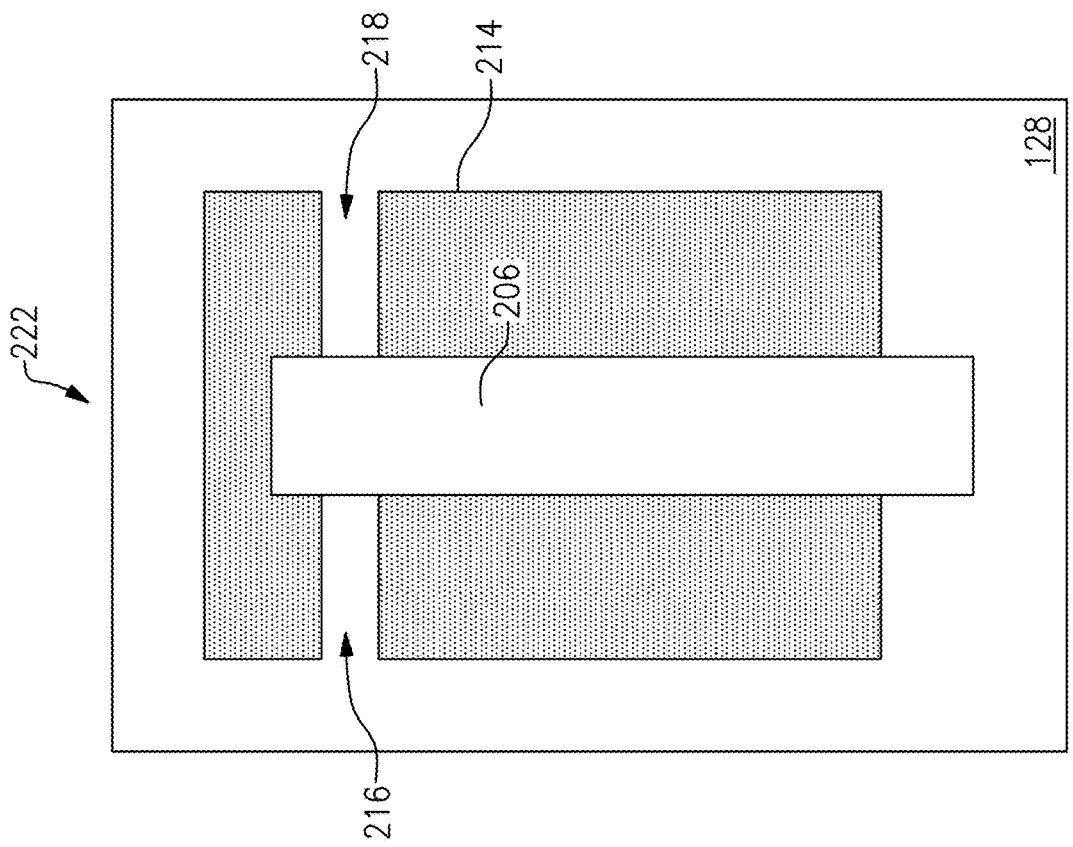
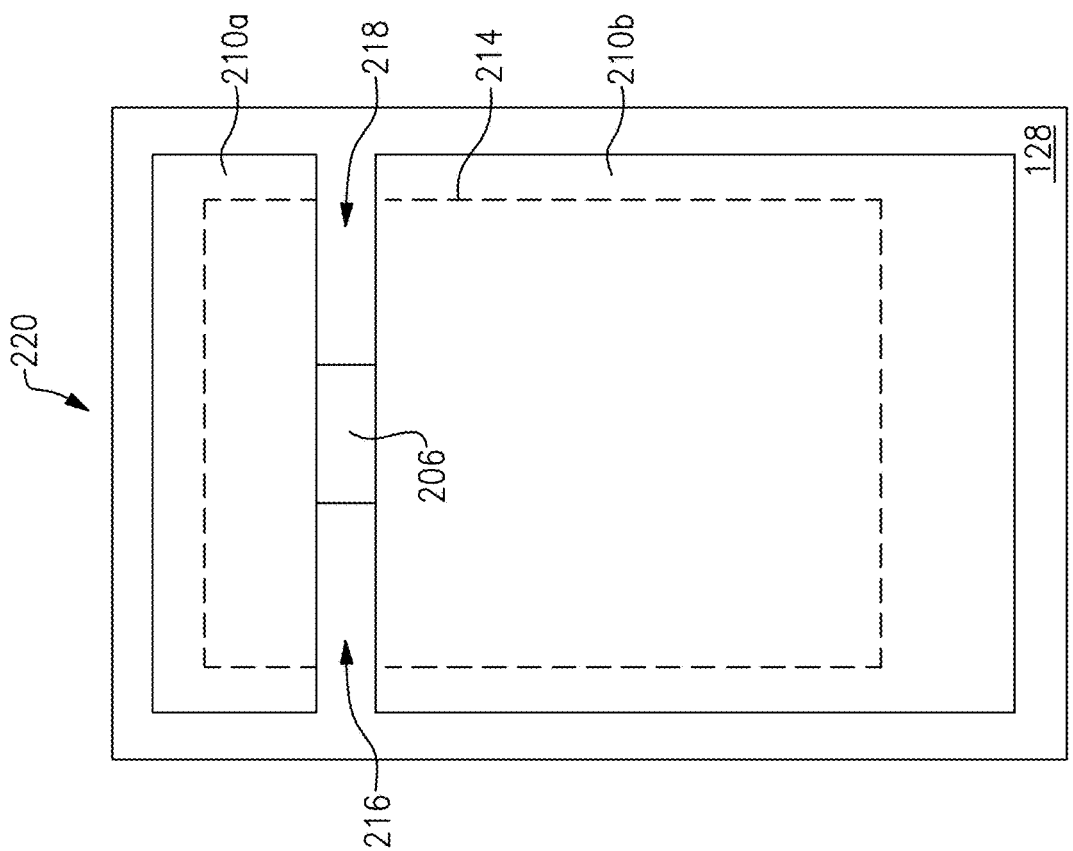

TRANSISTORS HAVING SELF-ALIGNED BODY TIE

CROSS-REFERENCE TO RELATED APPLICATION(S)

This application claims priority to U.S. Provisional Application No. 63/168,887 filed Mar. 31, 2021, entitled TRANSISTORS HAVING SELF-ALIGNED BODY TIE, the disclosure of which is hereby expressly incorporated by reference herein in its respective entirety.

BACKGROUND

Field

The present disclosure relates to transistors having self-aligned body tie.

Description of the Related Art

In metal-oxide-semiconductor field-effect transistors (MOSFETs) such as silicon-on-insulator transistors, a floating-body configuration can provide lower parasitic effects than a body-connected configuration. Thus, floating-body silicon-on-insulator transistors tend to provide better performance than body-connected silicon-on-insulator transistors. However, floating-body effect can limit practical applications of floating-body silicon-on-insulator transistors.

SUMMARY

In accordance with some implementations, the present disclosure relates to a transistor includes a source and a drain each implemented in a first type active region, a gate implemented relative to the source and the drain, and a body implemented in the first type active region and substantially covered by the gate. The transistor further includes a body tie implemented in a second type active region and including a connecting portion substantially covered by the gate and engaging the body, with the first and second active regions dimensioned to provide a gap therebetween on each side of the gate.

In some embodiments, the first type active region can include an N+ active region, and the second type active region can include a P+ active region. In some embodiments, the gate can have a symmetric shape about a line along a width direction of the gate. In some embodiments, the gate can have an I shape that covers the body and the connecting portion of the body tie.

In some embodiments, the connecting portion of the body tie can be aligned with the body based on a shape of the gate. In some embodiments, the aligned configuration of the connecting portion of the body tie and the body can result from formation of the gap between the first and second active region on each side of the gate. In some embodiments, the aligned engagement between the connecting portion of the body tie and the body can be the only engagement between the body tie and the body.

In some teachings, the present disclosure relates to a method for fabricating a transistor. The method includes forming or providing a first type active region and a second type active region, implementing a source and a drain with the first type active region, forming a body tie with the second type active region, and forming a gate relative to the source and the drain. The method further includes dimensioning either or both of the first and second type active regions to provide a gap between the first and second type active regions on each side of the gate, such that a connecting portion of the body tie engaging the body is substantially covered by the gate.

In some embodiments, the first type active region can include an N+ active region, and the second type active region can include a P+ active region. In some embodiments, the forming of the gate can include forming a symmetric shaped gate about a line along a width direction of the gate. In some embodiments, the gate can have an I shape that covers the body and the connecting portion of the body tie.

In some embodiments, the dimensioning can include removing portions of the first type active region to provide the gaps on both sides of the gate with a mask protecting the gate during the removing step. In some embodiments, the forming of the gaps with the mask protecting the gate can result in a body under the gate and the connecting portion of the body tie under the gate being aligned with each other based on a shape of the gate. In some embodiments, the aligned engagement between the connecting portion of the body tie and the body can be the only engagement between the body tie and the body.

According to some implementations, the present disclosure relates to a semiconductor die that includes a substrate and one or more transistors implemented on the substrate. Each transistor includes a source and a drain each implemented as a first type active region, and a gate implemented relative to the source and the drain such that application of a voltage to the gate results in formation of a conductive channel between the source and the drain. The transistor further includes a body configured to provide the conductive channel upon the application of the voltage to the gate. The body is implemented in the first type active region and substantially covered by the gate. The transistor further includes a body tie implemented as a second type active region and including a connecting portion substantially covered by the gate and engaging the body, with the first and second active regions being dimensioned to provide a gap therebetween on each side of the gate.

In some embodiments, the substrate can include a silicon-on-insulator substrate. In some embodiments, each transistor can be configured as a radio-frequency transistor. In some embodiments, each transistor can be configured as a digital cell transistor or a switching transistor.

In some implementations, the present disclosure relates to a packaged module that includes a packaging substrate and a semiconductor die mounted on the packaging substrate. The semiconductor die includes one or more transistors. Each transistor includes a source and a drain each implemented as a first type active region, and a gate implemented relative to the source and the drain such that application of a voltage to the gate results in formation of a conductive channel between the source and the drain. The transistor further includes a body configured to provide the conductive channel upon the application of the voltage to the gate. The body is implemented in the first type active region and substantially covered by the gate. The transistor further includes a body tie implemented as a second type active region and including a connecting portion substantially covered by the gate and engaging the body, with the first and second active regions being dimensioned to provide a gap therebetween on each side of the gate.

In some implementations, the present disclosure relates to an electronic device that includes a power source and an integrated circuit implemented on a semiconductor die and powered by the power source. The integrated circuit includes one or more transistors. Each transistor includes a source and a drain each implemented as a first type active region, and a gate implemented relative to the source and the drain such that application of a voltage to the gate results in formation of a conductive channel between the source and the drain. The transistor further includes a body configured to provide the conductive channel upon the application of the voltage to the gate. The body is implemented in the first type active region and substantially covered by the gate. The transistor further includes a body tie implemented as a second type active region and including a connecting portion substantially covered by the gate and engaging the body, with the first and second active regions being dimensioned to provide a gap therebetween on each side of the gate.

In some embodiments, the integrated circuit can include a switching circuit, and each of the one or more transistors can be implemented as a switching transistor. In some embodiments, the electronic device can be a wireless device.

In some embodiments, each of the one or more transistors can be implemented as digital cell.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIGS. 8A to 8H show an example of a process that can be utilized to fabricate a transistor having a self-aligned body tie or body connection.

DETAILED DESCRIPTION OF SOME EMBODIMENTS

The headings provided herein, if any, are for convenience only and do not necessarily affect the scope or meaning of the claimed invention.

Figure 1:
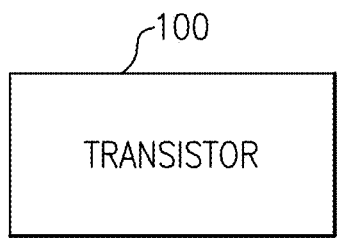
FIG. 1 depicts a transistor having one or more features as described herein.
Figure 2:
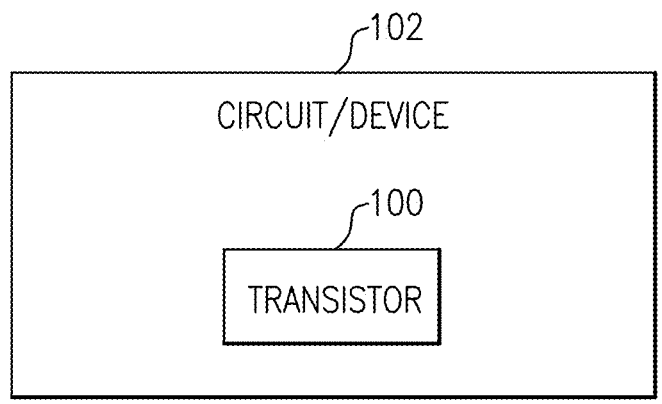
FIG. 2 shows that in some embodiments, the transistor of FIG. 1 can be implemented in a circuit and/or a device.

FIG. 1 depicts a transistor 100 having one or more features as described herein. FIG. 2 shows that in some embodiments, the transistor 100 of FIG. 1 can be implemented in a circuit and/or a device 102. Accordingly, the circuit/device 102 can benefit from the one or more features of the transistor 100. Examples related to such transistor and related circuit/device are described herein in greater detail.

In metal-oxide-semiconductor field-effect transistors (MOSFETs) such as silicon-on-insulator (SOI) transistors, a floating-body (FB) configuration can provide lower parasitics (e.g., parasitic capacitance) than a body-connected (BC) configuration. Thus, FB SOI transistors tend to provide better performance than BC SOI transistors. However, the floating-body effect can limit practical applications of FB SOI transistors.

It is noted that a floating body (FB) FET design is a common choice due to its performance features such as higher cutoff frequency ($f_T$) and higher transconductance ($g_m$) for an amplifier application such as a low noise amplifier on SOI. However, a FB FET may suffer a long settling time resulting from body potential drifting after a transient event. A notable mechanism that causes the slow settling behavior includes lack of minority carrier supply when the majority carrier is injected into or extracted from the body of the FB FET in the transient event. An equilibrium state of the body typically takes a longer time to reach if the annihilation of excess majority carrier only relies on the diffusion process.

It is also noted that a conventional body tie SOI FET typically uses a T-gate or L-gate configuration for the body tie connection. The body of a SOI FET refers to a silicon region underneath the gate whereas the body tie region refers to a silicon region with an implant such as a P+ implant. The body tie serves as a source of minority carrier to annihilate the majority carrier once the equilibrium state of the body is disturbed after a transient event. However, the T-gate or L-gate body tie SOI FET introduces a larger gate area which is needed to prevent N+ and P+ regions from shorting each other; accordingly, the gate is used as a buffer to separate the N+ and P+ regions.

In the foregoing body tie SOI FET configuration, the large gate area results in, for example, a large excess gate-to-source capacitance (Cgs) compared to a FB SOI FET, and such a large Cgs typically limits parameters such as $f_T$ and $g_m$. Further, extra source/drain to body junction capacitance is also introduced in T-gate or L-gate body tie configuration.

Figure 3:
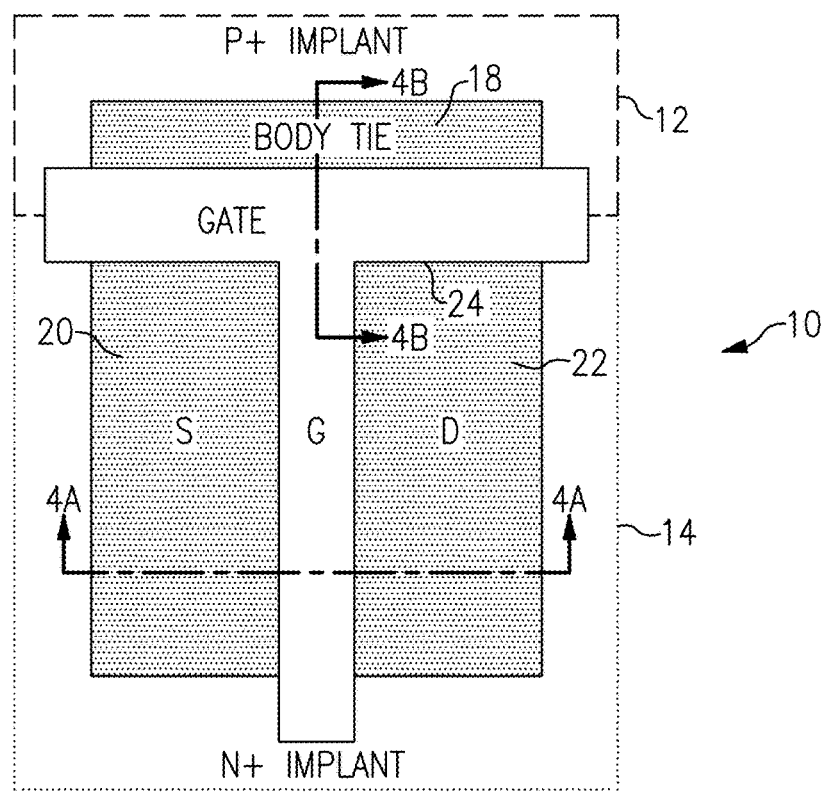
FIG. 3 shows an example of a silicon-on-insulator (SOI) transistor having a T-shaped gate and a conventional body tie configuration.
Figure 4A:
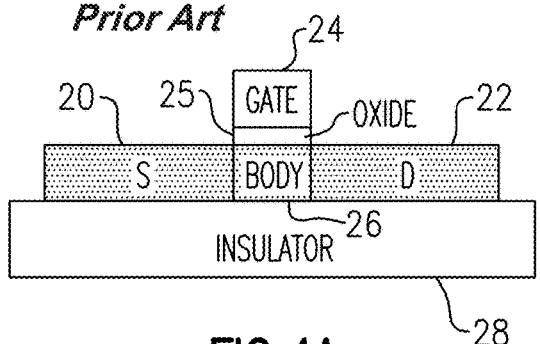
FIGS. 4A and 4B show sectional views as indicated in FIG. 3.
Figure 4B:
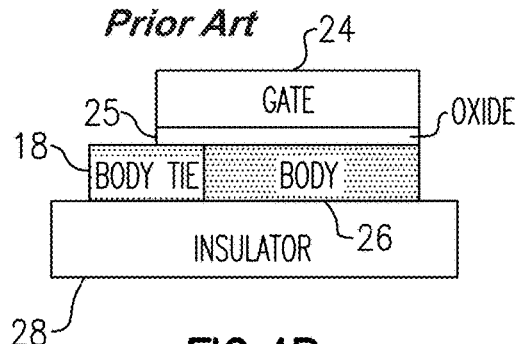
Figure 5:
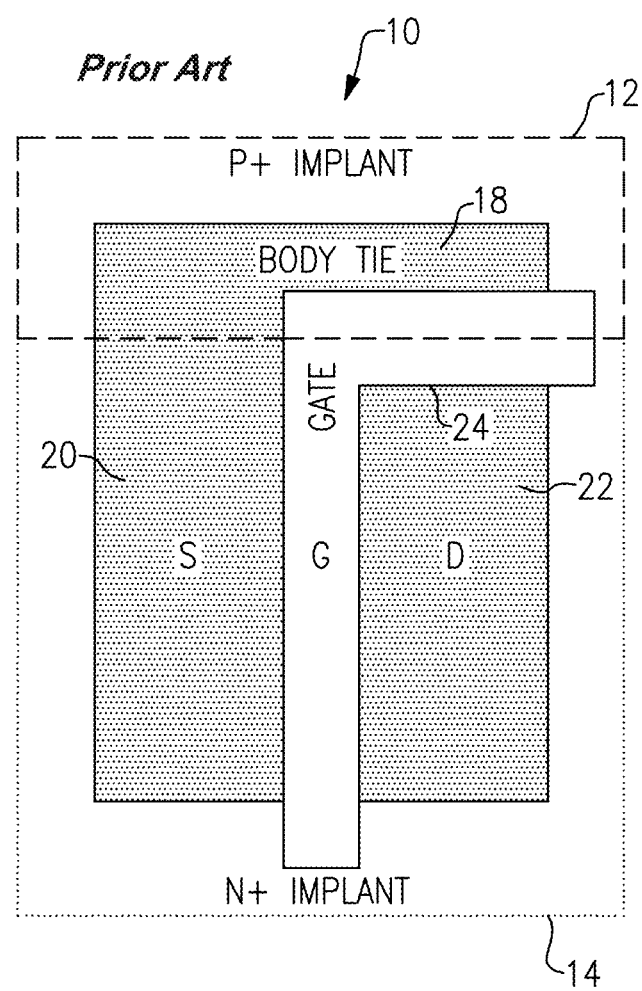
FIG. 5 shows another example of a silicon-on-insulator (SOI) transistor having an L-shaped gate and a conventional body tie configuration.

FIG. 3 shows an example of a silicon-on-insulator (SOI) transistor 10 having a T-shaped gate and a conventional body tie configuration. FIGS. 4A and 4B show sectional views as indicated in FIG. 3. FIG. 5 shows another example of a silicon-on-insulator (SOI) transistor 10 having an L-shaped gate and a conventional body tie configuration.

In FIGS. 3 and 4, the example transistor 10 is shown to include an N+ implant region 14 and a P+ implant region 12 formed over an insulator layer 28 (e.g., a buried oxide (BOX) layer). The N+ implant region 14 can include an N+ active region 20 and an N+ active region 22. Such active regions can function as source (S) and drain (D) of the transistor 10. The P+ implant region 12 can include a body tie 18 for the transistor 10.

In the example of FIGS. 3 and 4, a gate structure 24 is shown to be implemented over the foregoing regions 20, 22, 18. In some embodiments, such a gate can include, for example, polysilicon material. As shown in FIGS. 4A and 4B, a body 26 can be at least partially between the two N+ active regions 20, 22, and can be at least partially under the gate 24. Typically, an insulator layer such as a gate oxide layer 25 can be present between the gate 24 and the body 26.

FIG. 3 shows an example where the gate 24 has a T-shape. FIG. 5 shows another example of a silicon-on-insulator (SOI) transistor 10 having an L-shape gate 24. In the example of FIG. 5, the example transistor 10 is shown to include an N+ implant region 14 and a P+ implant region 12 formed over an insulator layer 28 (e.g., a buried oxide (BOX) layer). The N+ implant region 14 can include an N+ active region 20 and an N+ active region 22. Such active regions can function as source (S) and drain (D) of the transistor 10. The P+ implant region 12 can include a body tie 18 for the transistor 10.

In the example of FIG. 5, the L-shaped gate structure 24 is shown to be implemented over the foregoing regions 20, 22, 18. In some embodiments, such a gate can include, for example, polysilicon material. Similar to the example of FIG. 3, a body can be at least partially between the two N+ active regions 20, 22, and can be at least partially under the gate 24. Typically, an insulator layer such as a gate oxide layer can be present between the gate 24 and the body.

Figure 6A:
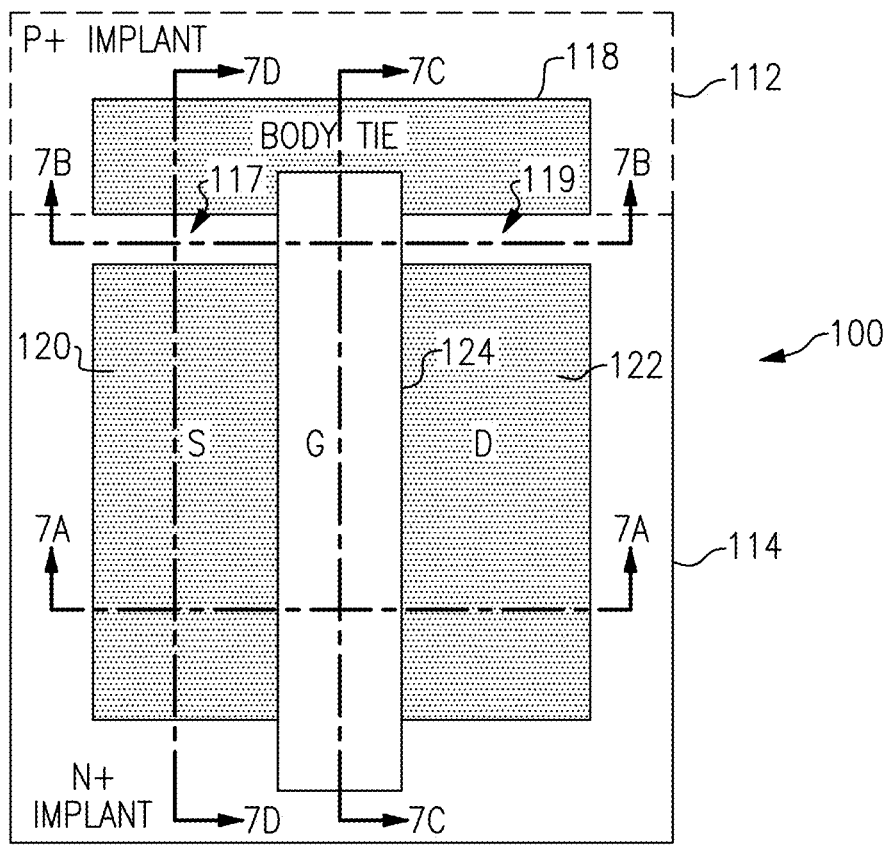
FIGS. 6A and 6B show plan and perspective views of an example silicon-on-insulator (SOI) transistor having a self-aligned body tie configuration.
Figure 6B:
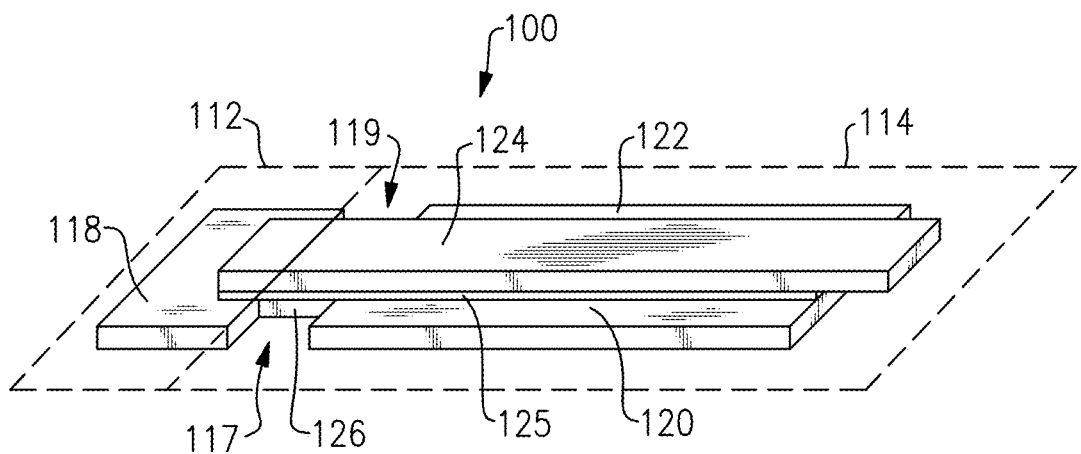
Figure 7A:
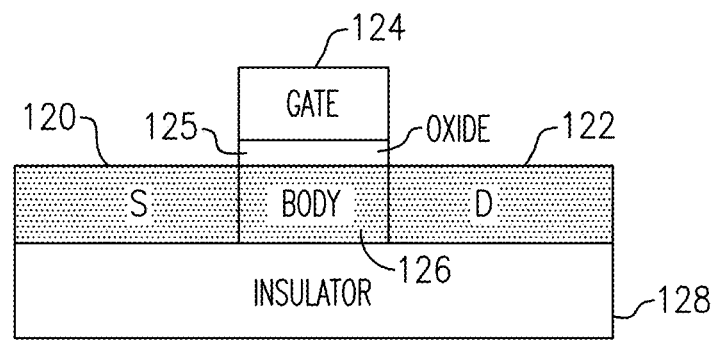
FIGS. 7A to 7D show sectional views as indicated in FIG. 6A.
Figure 7B:
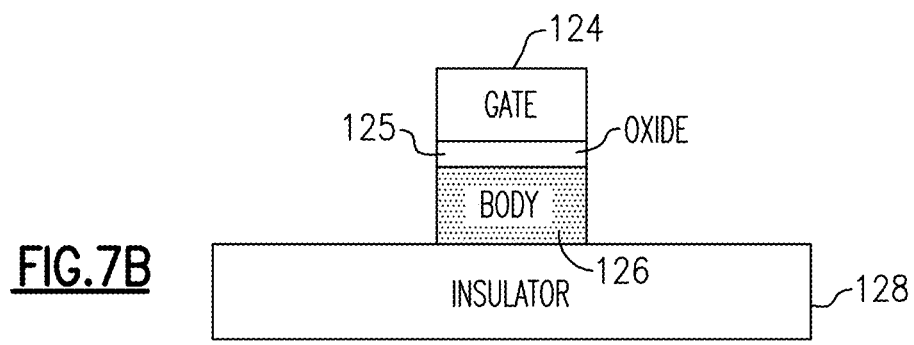
Figure 7C:
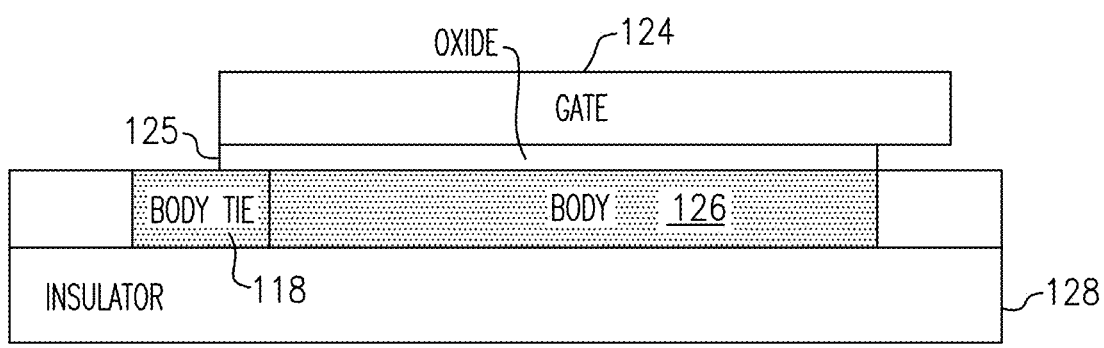
Figure 7D:
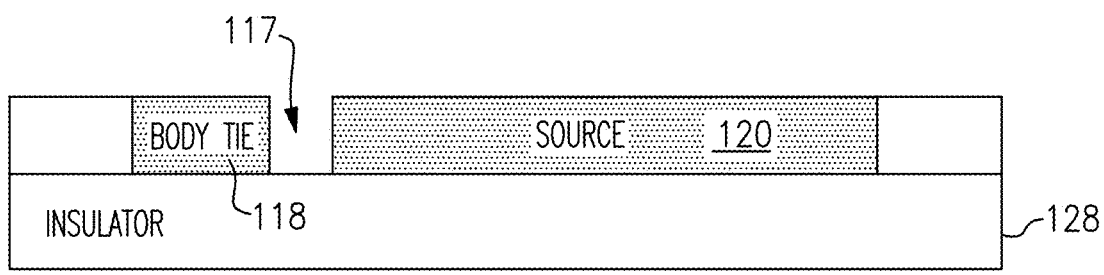

FIGS. 6A and 6B show plan and perspective views of an example of a silicon-on-insulator (SOI) transistor 100 having a self-aligned body tie configuration. FIGS. 7A to 7D show sectional views as indicated in FIG. 6A.

Referring to FIGS. 6 and 7, the transistor 100 is shown to include an N+ implant region 114 and a P+ implant region 112 formed over an insulator layer 128 (e.g., a buried oxide (BOX) layer). The N+ implant region 114 can include an N+ active region 120 and an N+ active region 122. Such active regions can function as source (S) and drain (D) of the transistor 100. The P+ implant region 112 can include a body tie 118 for the transistor 100.

In the example of FIGS. 6 and 7, a gate structure 124 is shown to be implemented over the foregoing regions 120, 122, 118. In some embodiments, such a gate can include, for example, polysilicon material. As shown in FIGS. 6B and 7A to 7C, a body 126 can be at least partially between the two N+ active regions 120, 122, and can be at least partially under the gate 124. Typically, an insulator layer such as a gate oxide layer 125 can be present between the gate 124 and the body 126.

FIGS. 6 and 7 show that in some embodiments, the transistor 100 can be configured such that the P+ and N+ regions 112, 114 are separated at region(s) not covered by the gate, such that the connection of the body 126 to the body tie region 118 is only underneath the gate 124. For example, a portion of the N+ active region 120 can be removed or be absent to define a gap 117, and a portion of the N+ active region 122 can be removed or be absent to define a gap 119, such that the N+ active regions 120, 122 do not physically engage the body tie region 118 directly, other than through the body 126 which is underneath the gate 124. Configured in such a manner, the transistor 100 can be free of, or have a substantially reduced, transient effect, and a substantially lower Cgs, compared to transistors having a conventional body tie configuration, such as the T-gate and L-gate examples of FIGS. 3 to 5.

For the purpose of description, the example transistor of FIGS. 6 and 7 can be referred to as having a self-aligned body tie or body connection, since such a body connection can be made to have substantially the same width and aligned with the gate during a fabrication process. Examples related to such a fabrication process are described herein in greater detail.

It is noted that in some embodiments, a transistor having a self-aligned body tie or body connection, such as in the example of FIGS. 6 and 7, can achieve a minimum or substantially reduced capacitance Cgs possible as technology scales without such constraints from T-gate or L-gate patterning requirements. It is also noted that in the foregoing transistor having a self-aligned body tie or body connection, little or no extra source/drain to body junction capacitance is introduced in the self-aligned body tie process when compared to a FB FET.

FIGS. 8A to 8H show an example of a process that can be utilized to fabricate a transistor having a self-aligned body tie or body connection, such as in the example of FIGS. 6 and 7.

FIG. 8A shows a process step where an active silicon region 200 can be formed over an insulator layer 128 such as a buried oxide (BOX) layer, so as to form an assembly 201. FIG. 8B shows a process step where a gate assembly 202 can be formed over the active region 200 of the assembly 201 of FIG. 8A, so as to form an assembly 204. In some embodiments, such a gate assembly can include a gate structure that includes polysilicon material and an insulator layer such as a gate oxide layer implemented to be between the polysilicon material and the active region 200.

Figure 8C:
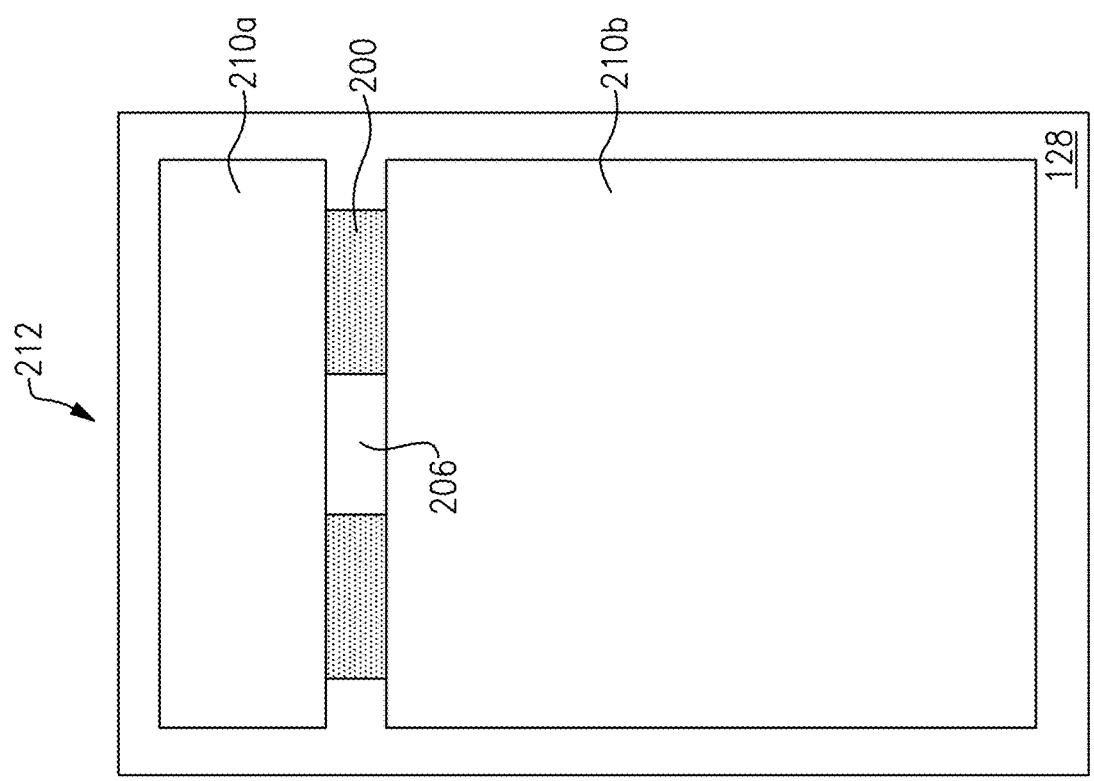

FIG. 8C shows a process step where a hardmask 206 can be formed over the gate assembly (202 in FIG. 8B), so as to form an assembly 208. Such a hardmask can protect the gate assembly during one or more subsequent etching operations.

Figure 8D:
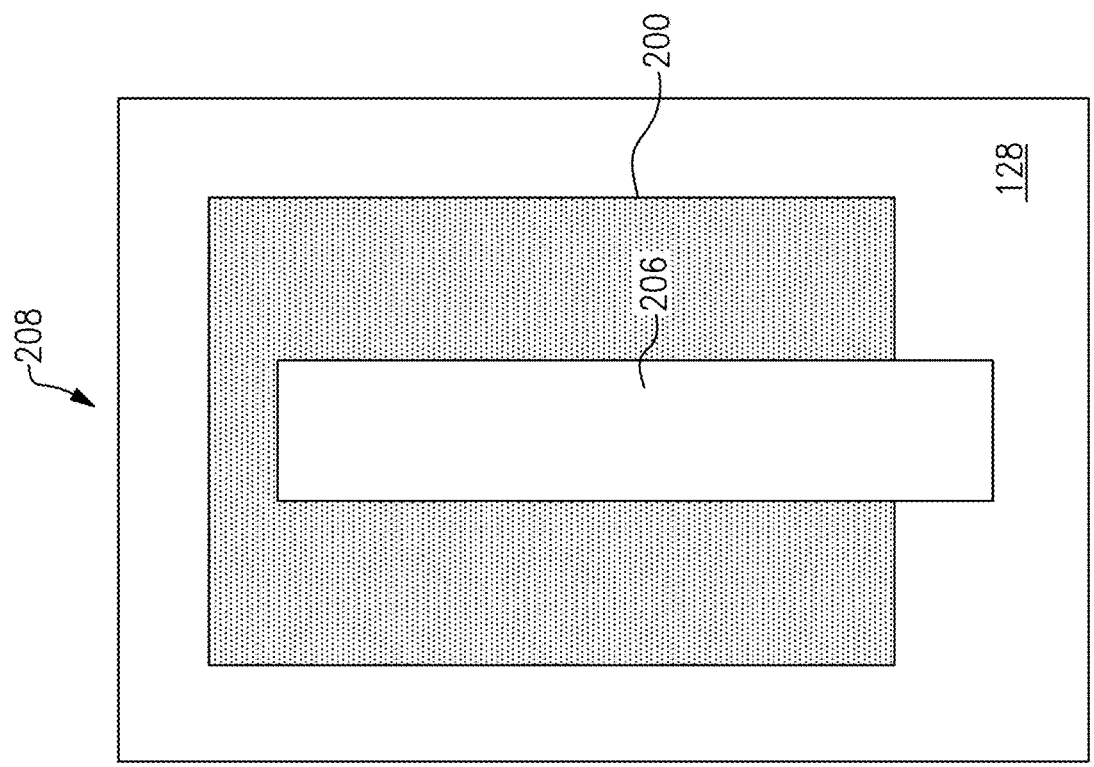

FIG. 8D shows a process step where a mask can be formed to define a portion of the active region 200 to be removed, so as to form an assembly 212. For example, a mask 210a can be formed over a portion of the active region 200 that will become a body tie (118 in FIGS. 6 and 7) and a corresponding portion of the hardmask 206; and a mask 210b can be formed over a portion of the active region 200 that will become source and drain (120, 122 in FIGS. 6 and 7) and a corresponding portion of the hardmask 206. Such example masks are shown to leave uncovered portions to be removed from the active region 200.

FIG. 8E shows a process step where the unmasked portions of the active region (200 in FIG. 8D) can be removed, so as to form an assembly 220. For example, a silicon etching process can be performed to substantially remove the unmasked regions of the active region 200 not covered by the masks 210a, 210b in FIG. 8D to form gaps 216, 218 on both sides of the hardmasked gate assembly, thereby forming an etched active region 214. Such a silicon etching process can be performed to stop at the BOX layer 128. It is noted that such an etching process to form the gaps 216, 218 in the active region 200 results in the body tie (118 in FIGS. 6 and 7) connection to the body underneath the gate assembly being self-aligned with respect to the gate assembly.

FIG. 8F shows a process step where the masks 210a, 210b of FIG. 8E can be removed, so as to form an assembly 222. Such a removal of the masks is shown to result in the etched active region 214 being exposed.

Figure 8H:
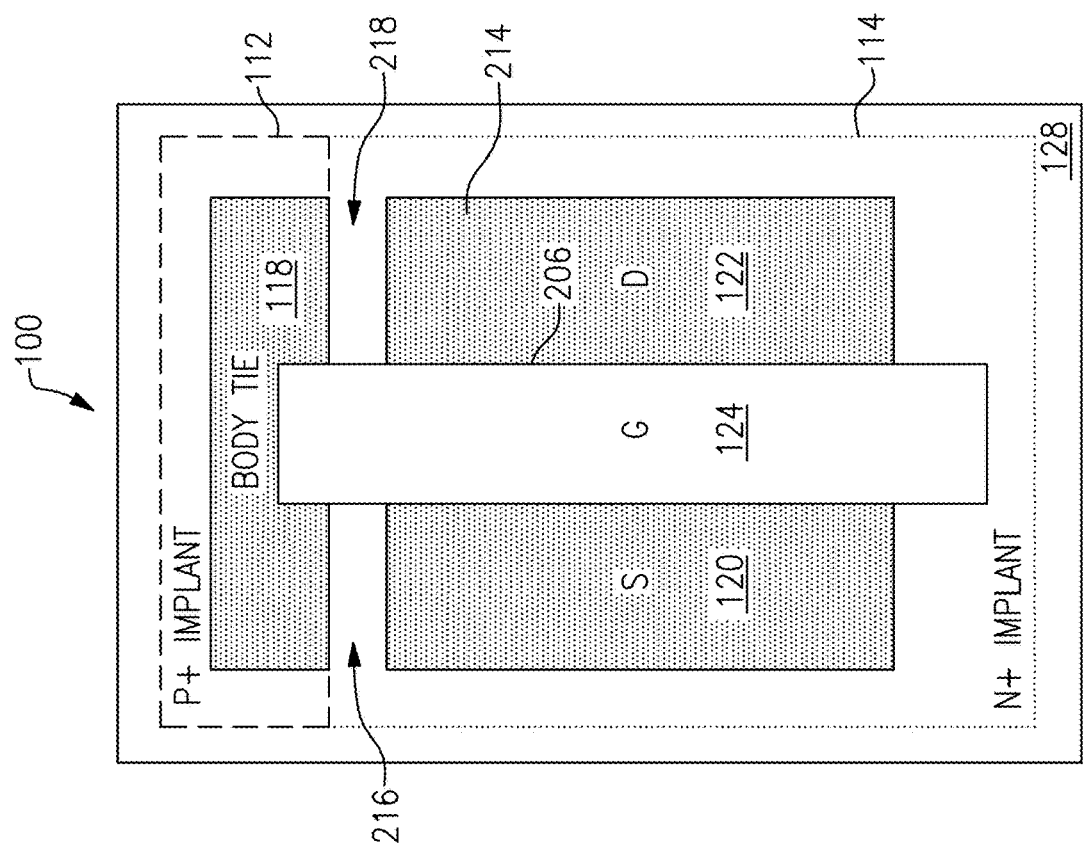
Figure 8G:
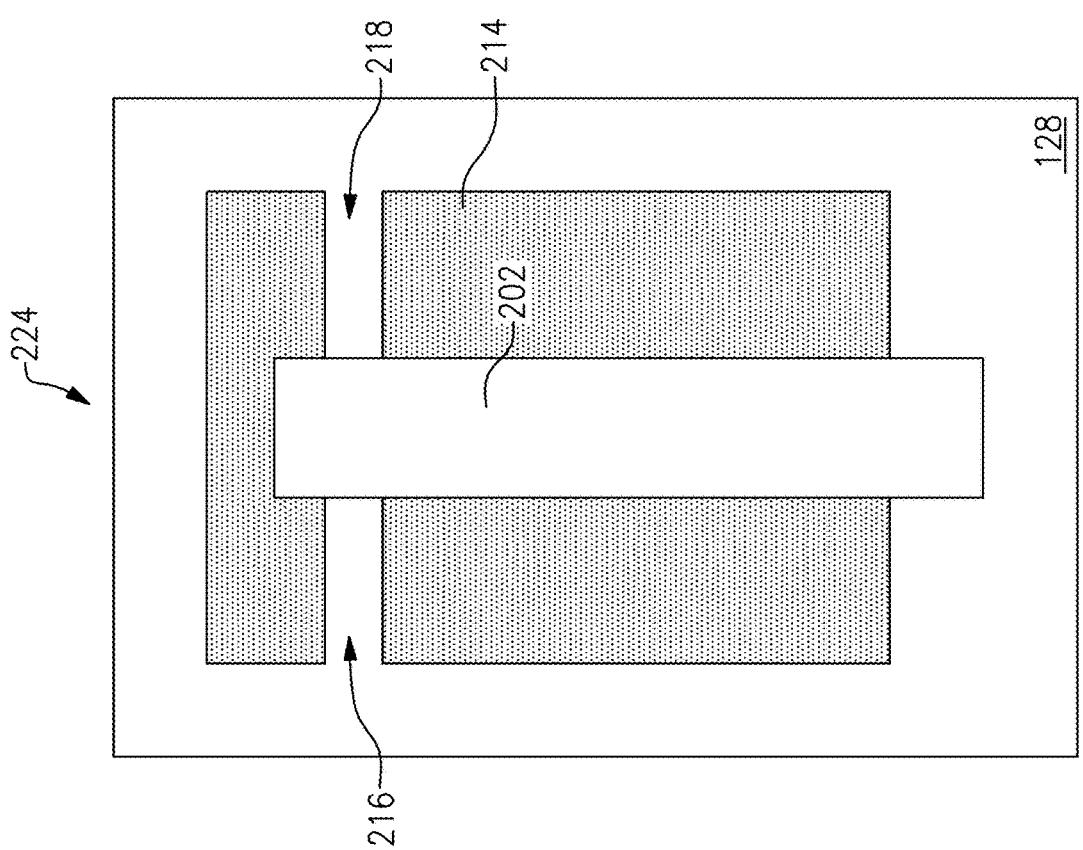

FIG. 8G shows a process step where the hardmask 206 of FIG. 8F can be removed, so as to form an assembly 224. Such a removal of the hardmask is shown to expose the gate assembly 202.

FIG. 8H shows a process step where P+ and N+ implants can be implemented to form P+ implant and N+ implant regions 112, 114, thereby forming a gate 124, source and drain 120, 122, and a body tie 118 as described herein. As also described herein, the gaps 216, 218 allow the body tie 118 to be connected to the body underneath the gate 124 in a self-aligned manner.

It is noted that a transistor such as those described herein in reference to FIGS. 6 to 8 can provide a number of desirable features. For example, such a transistor can be implemented with little or no increase in gate-to-source and junction capacitances. In another example, source and body nodes of the transistor need not be butted together as in the L-gate configuration of FIG. 5, thereby allowing greater freedom in body biasing configurations. In yet another example, the transistor design can eliminate or reduce drifting or hysteresis behavior of a floating-body transistor without significant performance degradation. In yet another example, the transistor design can improve speeds of implementations such as cell blocks due to reduced gate loading compared to a conventional T-gate or L-gate body tie transistor design.

Figure 9:
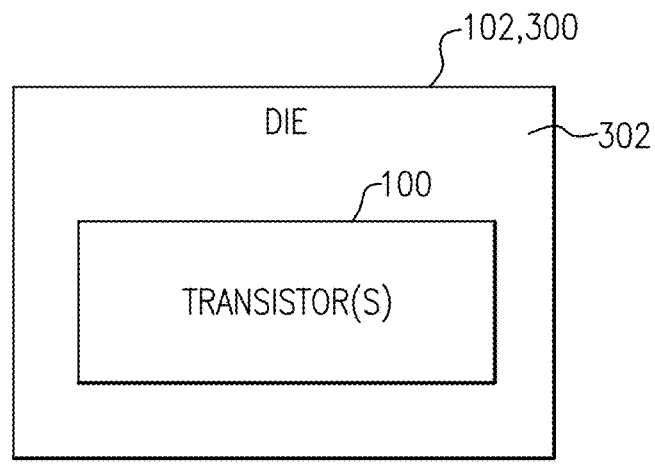
FIG. 9 shows that in some embodiments, a transistor having one or more features as described herein can be implemented on a device such as a die.

FIG. 9 shows that in some embodiments, one or more transistors 100 having one or more features as described herein can be implemented on a device 102 such as a die 300. Such a die can include a substrate 302 such as, for example, a silicon-on-insulator (SOI) substrate.

Figure 10:
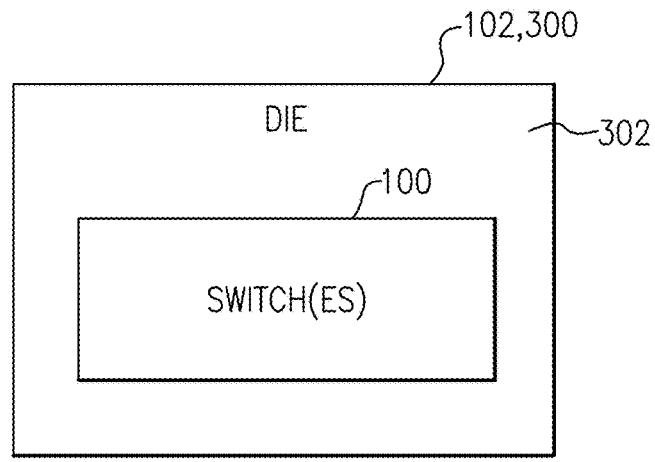
FIG. 10 shows that in some embodiments, the die/device of FIG. 9 can include one or more transistors configured as switch(es).
Figure 11:
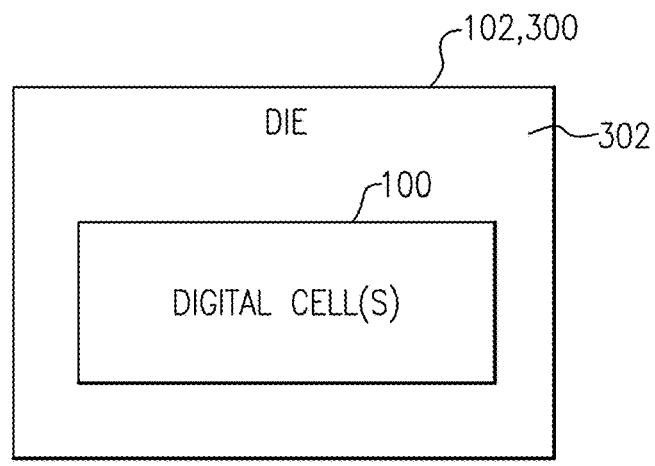
FIG. 11 shows that in some embodiments, the die/device of FIG. 9 can include one or more transistors configured as digital cell(s).

FIGS. 10 and 11 show examples of the die/device 300/102 of FIG. 9. FIG. 10 shows that in some embodiments, a die/device 300/102 can include one or more transistors 100 as described herein, configured as switch(es). In some embodiments, such switches can be configured as RF switches.

FIG. 11 shows that in some embodiments, a die/device 300/102 can include one or more transistors 100 as described herein, configured for digital applications. For example, one or more digital cells can be implemented with transistor(s) having one or more features as described herein.

Figure 12:
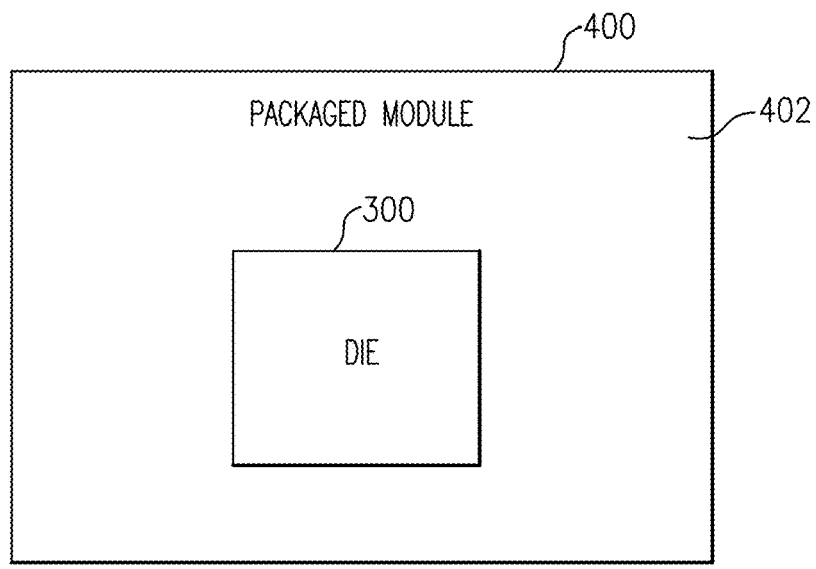
FIG. 12 shows that in some embodiments, a transistor having one or more features described herein can be implemented in a packaged module.

FIG. 12 shows that in some embodiments, one or more transistors having one or more features described herein can be implemented in a packaged module 400. Such a packaged module can include a packaging substrate 402 configured to receive a plurality of components. At least some of the components mounted on the packaging substrate 402 can include a die 300 such as one or more of the example die 300 of FIGS. 9-11.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 13:
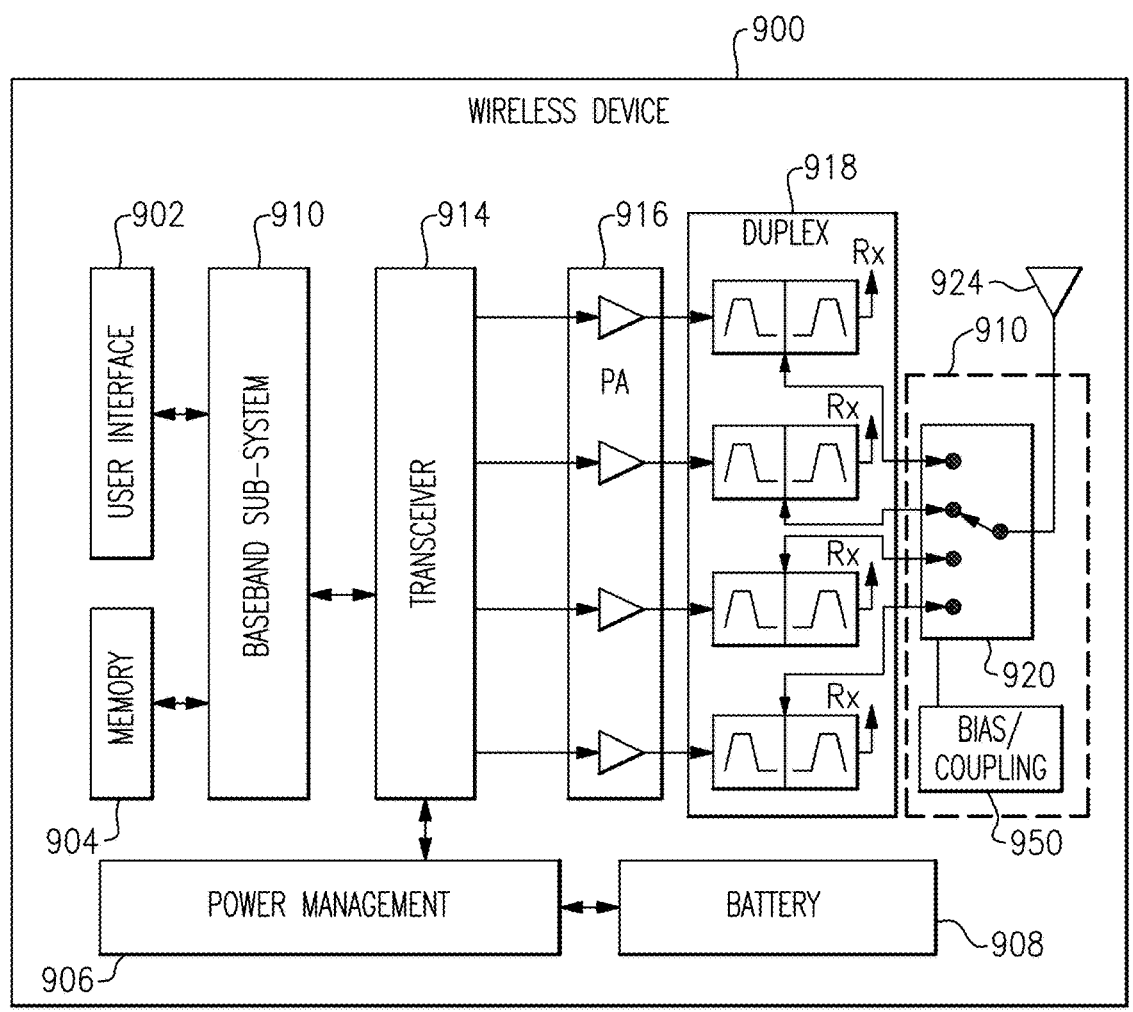
FIG. 13 depicts an example wireless device having one or more advantageous features described herein.

FIG. 13 depicts an example wireless device 900 having one or more advantageous features described herein. In the context of various transistors as described herein, a switch 920 based on such transistors can be implemented in a module 910. It will be understood that a transistor having one or more features as described herein can also be utilized in other portions of the wireless device.

In the example wireless device 900, a power amplifier (PA) assembly 916 having a plurality of PAs can provide one or more amplified RF signals to the switch 920 (via an assembly of one or more duplexers 918), and the switch 920 can route the amplified RF signal(s) to one or more antennas. The PAs 916 can receive corresponding unamplified RF signal(s) from a transceiver 914 that can be configured and operated in known manners. The transceiver 914 can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900. Such a power management component can also control operations of the baseband sub-system 910 and the module 910.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexers 918 can allow transmit and receive operations to be performed simultaneously using a common antenna (e.g., 924). In FIG. 13, received signals are shown to be routed to "Rx" paths that can include, for example, one or more low-noise amplifiers (LNAs).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A transistor comprising:
    a source and a drain each implemented in a first type active region;
    a gate implemented relative to the source and the drain;
    a body implemented in the first type active region and substantially covered by the gate;
    a body tie implemented in a second type active region; and
    a connecting portion that connects the body tie to the body, the connecting portion and the gate dimensioned such that the connecting portion is only underneath a respective portion of the gate and the respective portion of the gate is only over the connecting portion.

2. The transistor of claim 1 wherein the first type active region includes an N+ active region, and the second type active region includes a P+ active region.

3. The transistor of claim 2 wherein the gate has a symmetric shape about a line along a width direction of the gate.

4. The transistor of claim 3 wherein the gate has an I shape that covers the body and the connecting portion.

5. The transistor of claim 1 wherein the connecting portion is aligned with the body based on a shape of the gate.

6. The transistor of claim 5 wherein the first and second active regions are dimensioned to provide a gap therebetween on each side of the gate, such that the aligned configuration of the connecting portion and the body is provided by the gap between the first and second active regions on each side of the gate.

7. A semiconductor die comprising:
    a substrate; and
    one or more transistors implemented on the substrate, each transistor including a source and a drain each implemented in a first type active region, a gate implemented relative to the source and the drain, a body implemented in the first type active region and substantially covered by the gate, and a body tie implemented in a second type active region, the transistor further including a connecting portion that connects the body tie to the body, the connecting portion and the gate dimensioned such that the connecting portion is only underneath a respective portion of the gate and the respective portion of the gate is only over the connecting portion.

8. The semiconductor die of claim 7 wherein the substrate includes a silicon-on-insulator substrate.

9. The semiconductor die of claim 7 wherein each transistor is configured as a radio-frequency transistor.

10. The semiconductor die of claim 7 wherein each transistor is configured as a digital cell transistor or a switching transistor.

* * * * *